(12) United States Patent
Carothers

(10) Patent No.: US 8,946,739 B2
(45) Date of Patent: Feb. 3, 2015

(54) PROCESS TO FABRICATE INTEGRATED MWIR EMITTER

(75) Inventor: Daniel Carothers, Milford, NH (US)

(73) Assignee: Lateral Research Limited Liability Company, Wilmington, DE (US)

( * ) Notice: Subject to any disclaimer, the term of this patent is extended or adjusted under 35 U.S.C. 154(b) by 724 days.

(21) Appl. No.: 11/919,299

(22) PCT Filed: Oct. 2, 2006

(86) PCT No.: PCT/US2006/038308
§ 371 (c)(1),
(2), (4) Date: Oct. 24, 2007

(87) PCT Pub. No.: WO2007/041428
PCT Pub. Date: Apr. 12, 2007

(65) Prior Publication Data
US 2009/0294783 A1    Dec. 3, 2009

Related U.S. Application Data

(60) Provisional application No. 60/722,308, filed on Sep. 30, 2005.

(51) Int. Cl.
*H01L 33/00*    (2010.01)
*H05B 3/26*    (2006.01)

(52) U.S. Cl.
CPC .............. *H05B 3/265* (2013.01); *H04L 31/101* (2013.01)
USPC ................... 257/98; 257/79; 257/440; 438/22

(58) Field of Classification Search
USPC ........................ 257/440, 79; 438/22
See application file for complete search history.

(56) References Cited

U.S. PATENT DOCUMENTS

| | | | | |
|---|---|---|---|---|
| 5,149,956 A | * | 9/1992 | Norton | 257/188 |
| 5,371,431 A | * | 12/1994 | Jones et al. | 313/309 |
| 5,541,124 A | * | 7/1996 | Miwa et al. | 438/366 |
| 5,557,160 A | * | 9/1996 | Makishima et al. | 313/336 |
| 5,567,954 A | * | 10/1996 | Dobson et al. | 257/3 |
| 5,581,084 A | * | 12/1996 | Chapman et al. | 250/338.4 |
| 5,629,580 A | * | 5/1997 | Mandelman et al. | 313/310 |
| 5,637,023 A | * | 6/1997 | Itoh et al. | 445/24 |
| 5,637,539 A | * | 6/1997 | Hofmann et al. | 438/20 |
| 5,666,019 A | * | 9/1997 | Potter | 313/306 |
| 5,735,721 A | * | 4/1998 | Choi | 445/24 |
| 5,834,790 A | * | 11/1998 | Suzuki | 257/10 |
| 5,834,885 A | * | 11/1998 | Itoh et al. | 313/336 |
| 5,844,250 A | * | 12/1998 | Itoh et al. | 257/10 |
| 5,903,092 A | * | 5/1999 | Akama | 313/311 |
| 5,942,047 A |   | 8/1999 | Fraas et al. | |

(Continued)

FOREIGN PATENT DOCUMENTS

WO    2007041428    4/2007

OTHER PUBLICATIONS

United States Patent and Trademark Office ISA; International Search Report and Written Opinion PCT/US06/38308; Mar. 26, 2009; 5 Pages.

*Primary Examiner* — Caleb Henry
(74) *Attorney, Agent, or Firm* — Stolowitz Ford Cowger LLP

(57) ABSTRACT

A device for medium wavelength infrared emission and a method for the manufacture thereof is provided. The device has a semiconductor substrate; a passive hermetic barrier disposed upon the substrate, and an emitter element disposed within said hermetic barrier; and a mirror.

16 Claims, 11 Drawing Sheets

(56) References Cited

U.S. PATENT DOCUMENTS

| | | | |
|---|---|---|---|
| 5,959,339 A * | 9/1999 | Chapman et al. | 257/440 |
| 6,004,830 A * | 12/1999 | Potter | 438/20 |
| 6,034,407 A * | 3/2000 | Tennant et al. | 257/440 |
| 6,190,984 B1 * | 2/2001 | Ryum et al. | 438/309 |
| 6,504,180 B1 * | 1/2003 | Heremans et al. | 257/98 |
| 6,518,670 B1 * | 2/2003 | Mandelman et al. | 257/752 |
| 6,525,387 B2 * | 2/2003 | Bauer et al. | 257/440 |
| 6,552,374 B2 * | 4/2003 | Han et al. | 257/197 |
| 6,628,052 B2 * | 9/2003 | Piehl | 313/309 |
| 6,713,313 B2 * | 3/2004 | Derraa | 438/20 |
| 6,790,701 B2 * | 9/2004 | Shigenaka et al. | 438/93 |
| 6,795,231 B1 * | 9/2004 | Koscielniak | 359/321 |
| 6,817,916 B2 * | 11/2004 | Piehl | 445/24 |
| 7,196,349 B2 * | 3/2007 | Alavi et al. | 257/21 |
| 2001/0006842 A1 * | 7/2001 | Hattori | 438/584 |
| 2005/0142677 A1 * | 6/2005 | Kon et al. | 438/22 |
| 2005/0253129 A1 | 11/2005 | Tsai et al. | |
| 2008/0129178 A1 * | 6/2008 | Hudspeth et al. | 313/309 |

* cited by examiner

PROCESS TO FABRICATE INTEGRATED MWIR EMITTER

RELATED APPLICATIONS

This application claims the benefit of U.S. Provisional Application No. 60/722,308, filed Sep. 30, 2005. This application is herein incorporated in its entirety by reference.

FIELD OF THE INVENTION

The present invention relates to medium wavelength infrared (MWIR) narrow band emitters and more particularly to the heater and photonic band gap heater element used in such emitters

BACKGROUND OF THE INVENTION

In the manufacture of MWIR narrow band emitters, it was heretofore the practice to etch holes in a substrate and heat the substrate from behind. The resulting structure would act as a filter allowing only a narrow window of the IR radiation through. There was no gain in efficiency and the tolerances in manufacturing were not easy to achieve. In addition the previous method and structure used gold. The emissivity of gold is very low, also adding to the low power efficiency.

There is, therefore, a need for a more efficient process for manufacturing MWIR narrow band emitters. In particular, there is a need to integrate the additive tungsten CVD process of the present invention allows for better control of the device parameters.

BRIEF SUMMARY OF THE INVENTION

One embodiment of the present invention is a method for manufacturing a MWIR emitter comprising the step of using a chemically polished tungsten array combined with a passive hermetic barrier and mirror to create a high performance emitter. In addition, the heater of the present invention is a metal photonic band gap (PBG) filter. By using a high emissivity material like tungsten we are able to develop greater energy densities at the photonic band gap structure.

One embodiment of the present invention provides a device for medium wavelength infrared emission, that device having: a semiconductor substrate; a passive hermetic barrier disposed upon the substrate; an emitter element disposed within the passive hermetic barrier; and a mirror.

Another embodiment of the present invention provides such a device further comprising a cavity disposed in the substrate.

A further embodiment of the present invention provides such a device wherein the semiconductor substrate comprises silicon.

Yet another embodiment of the present invention provides such a device wherein the mirror comprises gold.

A yet further embodiment of the present invention provides such a device wherein the hermetic barrier comprises a nitride.

Even another embodiment of the present invention provides such a device wherein the nitride is selected from the group of nitrides consisting of silicon nitride and boron nitride.

One embodiment of the present invention provides a method of manufacturing an integrated medium wavelength infrared emitter, the method comprising: providing a substrate; applying a first barrier layer to the substrate; depositing a mold layer disposed on the first barrier layer; planarizing the mold layer; etching the mold layer thereby creating at least one emitter mold; depositing emitter material upon the mold layer and in the emitter mold; chemically polishing excess the emitter material; and removing the mold layer by etching.

Another embodiment of the present invention provides such a method further comprising etching a well into the substrate between a first and second the emitter.

A further embodiment of the present invention provides such a method further comprising applying a second barrier layer to the emitter material.

Yet another embodiment of the present invention provides such a method further comprising depositing a reflective coating on the second barrier.

A yet further embodiment of the present invention provides such a method wherein the reflective coating comprises gold.

Even another embodiment of the present invention provides such a method wherein the reflective coating is between 250 and 500 angstroms thick.

An even further embodiment of the present invention provides such a method further comprising etching the substrate thereby forming wells prior to applying the first barrier layer.

Yet another wherein the first barrier layer comprises a barrier material selected from the group of barrier materials consisting of boron nitride and silicon nitride.

A yet further embodiment of the present invention provides such a method wherein the mold layer comprises silicon dioxide.

Still another embodiment of the present invention provides such a method further comprising etching the substrate thereby creating wells after removing the mold layer by etching.

A still further embodiment of the present invention provides such a method wherein the emitter material is selected from the group of emitter materials consisting of tungsten, silicon carbide, carbon and alloys thereof.

One embodiment of the present invention provides an integrated middle wavelength infrared emitter manufactured by a method comprising: providing a substrate; applying a thin silicon nitride layer to the substrate; depositing a silicon dioxide mold layer disposed on the thin silicon nitride layer; planarizing the silicon dioxide mold layer; etching the silicon dioxide mold layer thereby creating at least one emitter mold; depositing tungsten upon the mold layer and in the emitter mold; chemically polishing excess the tungsten; and removing the silicon dioxide by etching.

Another embodiment of the present invention provides such an emitter wherein the thin silicon nitride layer is not greater than 500 angstroms.

A further embodiment of the present invention provides such a emitter wherein the method further comprises applying a protective layer of silicon nitride and applying a layer of gold to active areas of the emitter.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention is further described with reference to the accompanying drawings wherein.

DETAILED DESCRIPTION OF THE INVENTION

One embodiment of the present invention provides emitters having tungsten based emitter heater structure and a method to fabricate the same. Such an emitter allows for the efficient generation of spectrally confined infrared emission. The efficiency of the emitter is further improved in embodiments where a reflective coating of gold is applied to the active emitters.

Gold, while possessing reflective properties desirable for emitter grids and mirrors, does not make a good heating element due to it's low resistivity and emissivity. For an isolated high emissive heater, materials such tungsten, silicon carbide or carbon are better suited.

In one embodiment of the present invention, these heater elements are formed using a combination of mold fill and chemi-mechanical polishing (CMP) processes. While an embodiment of the present invention is described with respect to tungsten, other embodiments within the scope of the present invention could utilize silicon carbide, carbon or other suitable emitter materials. In embodiments utilizing tungsten, the method of the present invention makes use of a chemical vapor deposition (CVD) of tungsten to form the heater elements. In the case of other materials, a sputter deposition technology may be used. CMP is utilized at various points in the process to planarize and reveal desired components.

A coating of gold may be applied to the emitter and exposed substrate, thereby adding a reflective coating to the emitter surface and improving performance.

In one embodiment of the present invention, the heating emitter elements may be configured such that they are disposed between channels or cavities that are provided with a depth that is equal to a whole number multiple of the wavelength of the emitted radiation. In one such embodiment, the depth of the finished well is between one and two times the wavelength of the radiation emitted.

Figure 1:
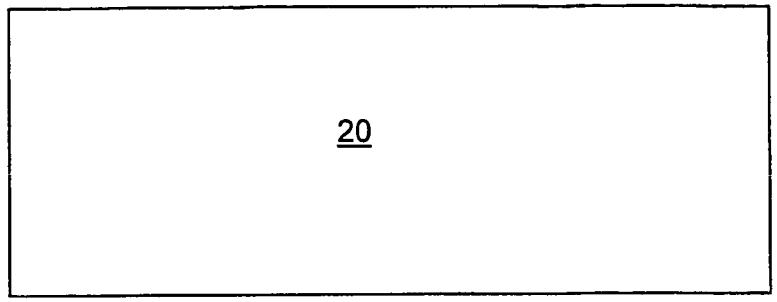
FIG. 1 is a block diagram illustrating a silicon substrate of an emitter configured in accord with one embodiment of the present invention.
Figure 2:
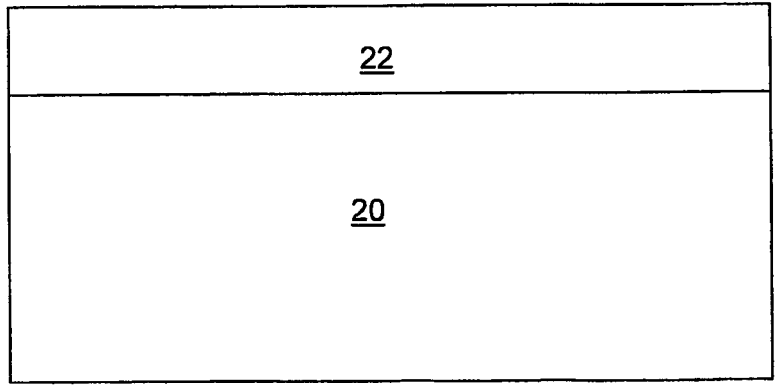
FIG. 2 is a block diagram illustrating a silicon substrate coated with a silicon nitride layer of an emitter configured in accord with one embodiment of the present invention.

As illustrated in FIG. 2, a protective film of silicon nitride 22 is disposed on the surface of a silicon substrate wafer 20, coating the surface of the wafer. In one embodiment of the present invention, 500 angstroms or less of silicon nitride are deposited on the surface of a bare silicon wafer 20. The layer of silicon nitride 22 electrically and physically isolates silicon substrate 20 from tungsten heater elements disposed thereon, and allows etching various sacrificial layers during the processing of the device without erosion of the silicon substrate 20.

Figure 3:
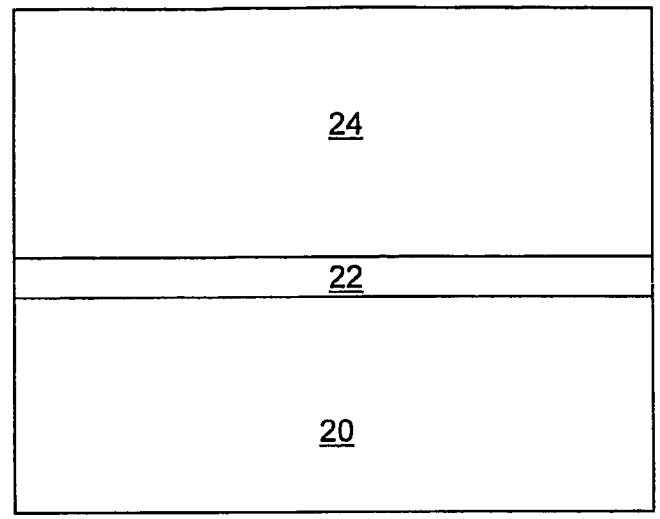
FIG. 3 is a block diagram illustrating a silicon substrate and sacrificial silicon dioxide mold layer for forming an emitter configured in accord with one embodiment of the present invention.

In one embodiment of the present invention, illustrated in FIG. 3, a coating of silicon dioxide 24 is applied to the silicon nitride layer 22. For structures with a desired active emitter device with a depth of about approximately 10,000 angstroms, a layer of silicon dioxide of, in one embodiment about approximately 11,000 angstroms is deposited over the silicon nitride. One skilled in the art will readily appreciate that the depth of the mold is related to the depth of the desired emitter, and further, the layer of silicon dioxide deposited must be thicker than the desired mold depth. In this way the silicon dioxide is applied in sufficient thickness to allow for chemi-mechanical polishing of the surface down to the desired mold thickness.

Figure 4:
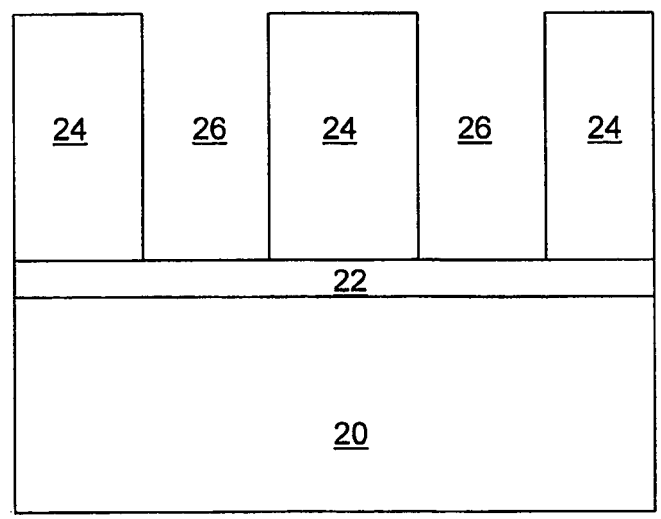
FIG. 4 is a block diagram illustrating a silicon substrate and sacrificial silicon dioxide mold layer with etched mold openings for forming an emitter configured in accord with one embodiment of the present invention.

Once at the desired thickness, the silicon dioxide layer 24 disposed on the silicon nitride layer is patterned using deep ultraviolet lithography or other suitable technique and etched to form the mold pattern for the heater element. The resulting structure is illustrated in FIG. 4. Cavities 26 are disposed between remaining structures of silicon dioxide 24. These structures 24 are the negative of the desired pattern of emitters.

Figure 5:
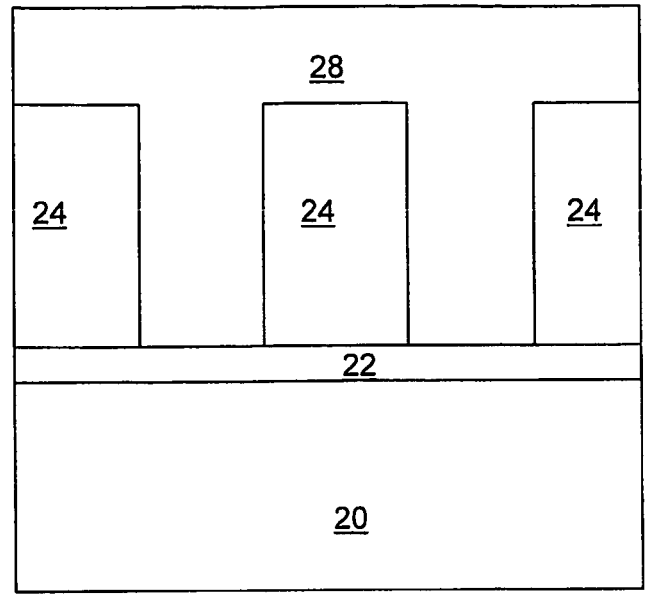
FIG. 5 is a block diagram illustrating a deposition of a layer of emitter material for forming an emitter configured in accord with one embodiment of the present invention.
Figure 6:
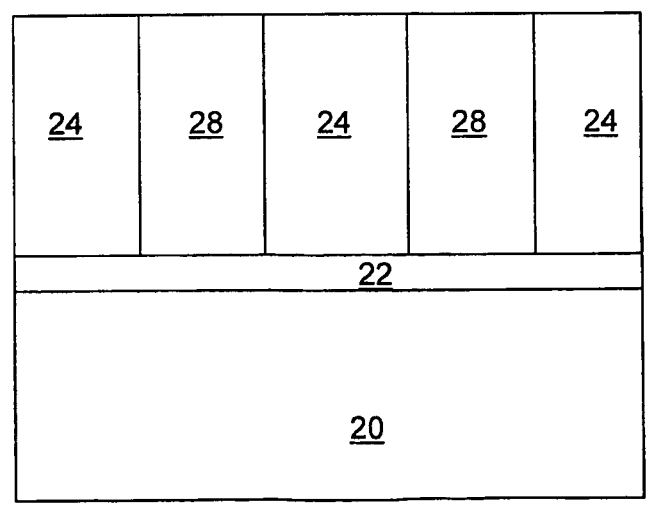
FIG. 6 is a block diagram illustrating removal by chemi-mechanical polishing of excess emitter material of an emitter configured in accord with one embodiment of the present invention.

Once a mold has been formed, the emissive material may be deposited. As illustrated in FIG. 5, using, in one embodiment, tungsten hexaflorite Chemical Vapor Deposition (CVD), a coating of tungsten 28 is deposited over the surface of the wafer. The thickness of this coating of tungsten shall be thick enough to fill cavities forming molds in the silicon dioxide 24 and thereby create a solid tungsten plug or wire in the mold. CMP is then used to remove unwanted Tungsten and planerize the surface of the structure, removing, in one embodiment, approximately 10,000 angstroms of material from the structure. The result, as illustrated in FIG. 6, leaves tungsten structures 28 disposed between the silicon dioxide structures 24.

Figure 7:
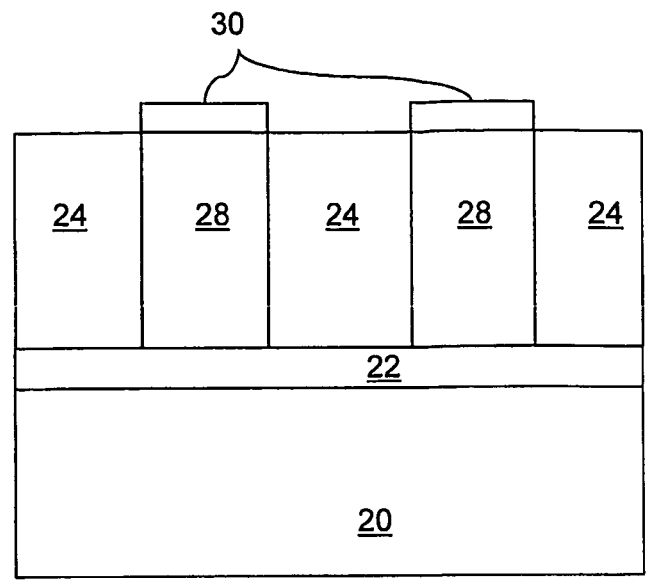
FIG. 7 is a block diagram illustrating patterning of an emitter configured in accord with one embodiment of the present invention.
Figure 8:
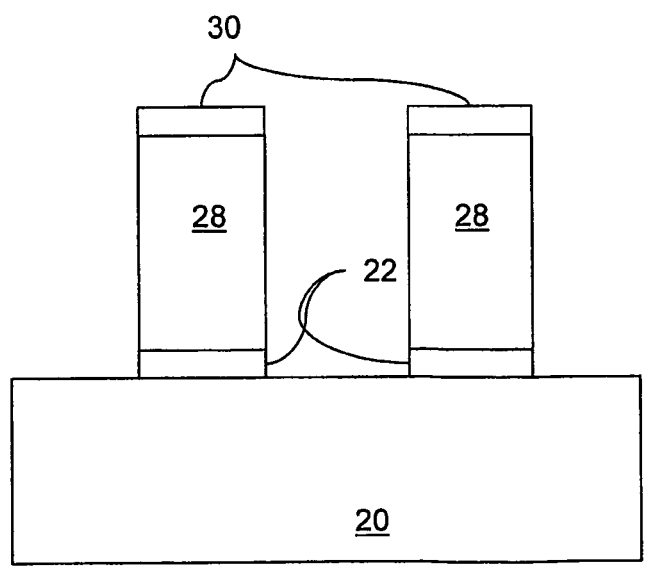
FIG. 8 is a block diagram illustrating removal of sacrificial silicon dioxide and excess silicon nitride from an emitter configured in accord with one embodiment of the present invention.
Figure 9:
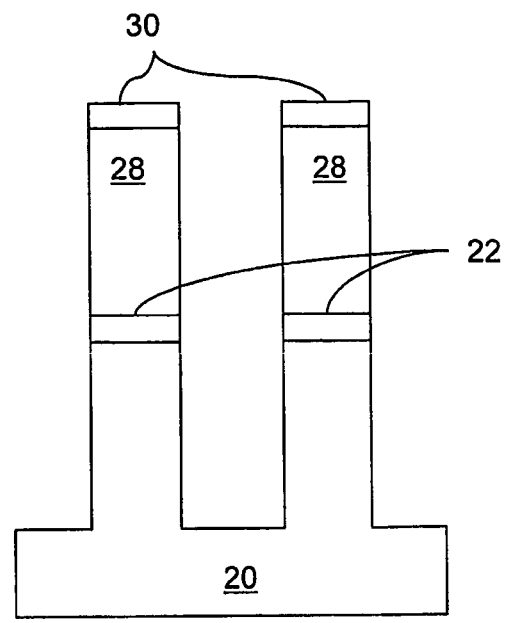
FIG. 9 is a block diagram illustrating removal of formation of wells in the substrate of an emitter configured in accord with one embodiment of the present invention.

As illustrated in FIG. 7, photoresist or other suitable patterning agent 30 is applied to the tungsten structures 28 to allow silicon dioxide 24 to be selectively removed from between the heater elements 28. In one embodiment, selective removal of non-masked regions of silicon dioxide 24 is made by wet etching (buffered hydrogen fluoride) is then used to remove the silicon dioxide 24 and the thin silicon nitride 22 resulting in the structure illustrated in FIG. 8. As illustrated in FIG. 9, either a dry or wet chemical etching processes are then used to etch the silicon 20 to a depth of between 2-4 microns. This structure is cleaned, effecting the removal of the photoresist layer 30, leaving tungsten 28, disposed upon silicon nitride 22, which is in turn disposed upon an etched silicon wafer 20.

Figure 10:
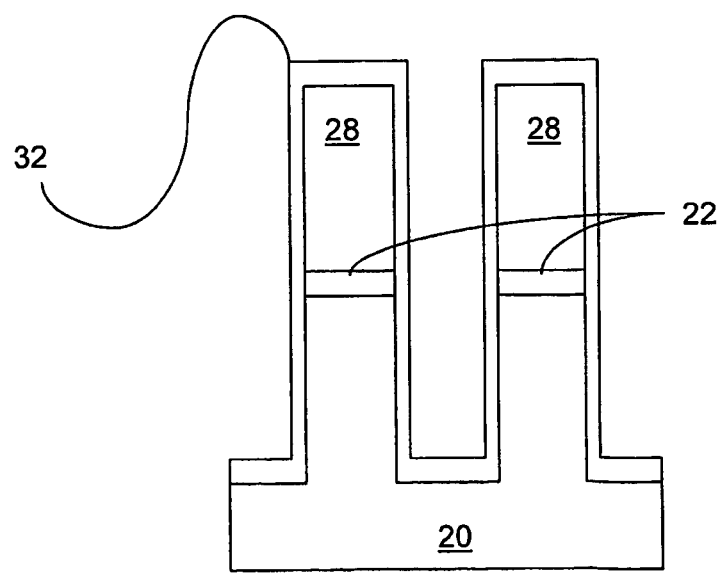
FIG. 10 is a block diagram illustrating application of silicon nitride to the surface of an emitter configured in accord with one embodiment of the present invention.

A layer of silicon nitride 32 is then applied to the surface of the structure, covering the tungsten 28, disposed upon silicon nitride 22, which is in turn disposed upon an etched silicon wafer 20, as illustrated in FIG. 10. This layer 32, may in one embodiment be approximately 1000 angstrom in thickness and is applied over the surface of the emitter to isolate and protect the tungsten heater elements 28.

Figure 11:
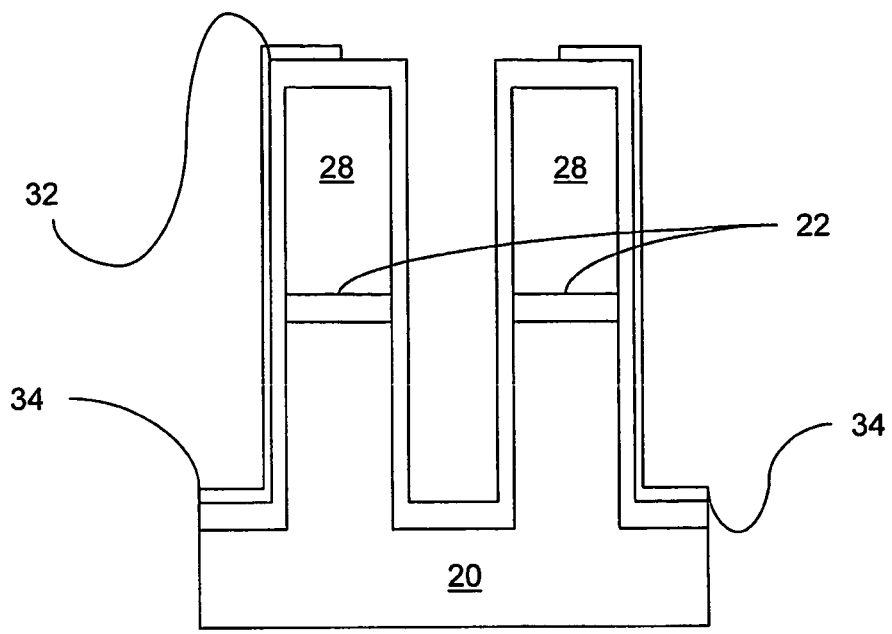
FIG. 11 is a block diagram illustrating removal of patterning of active emitter sites on an emitter configured in accord with one embodiment of the present invention.
Figure 12:
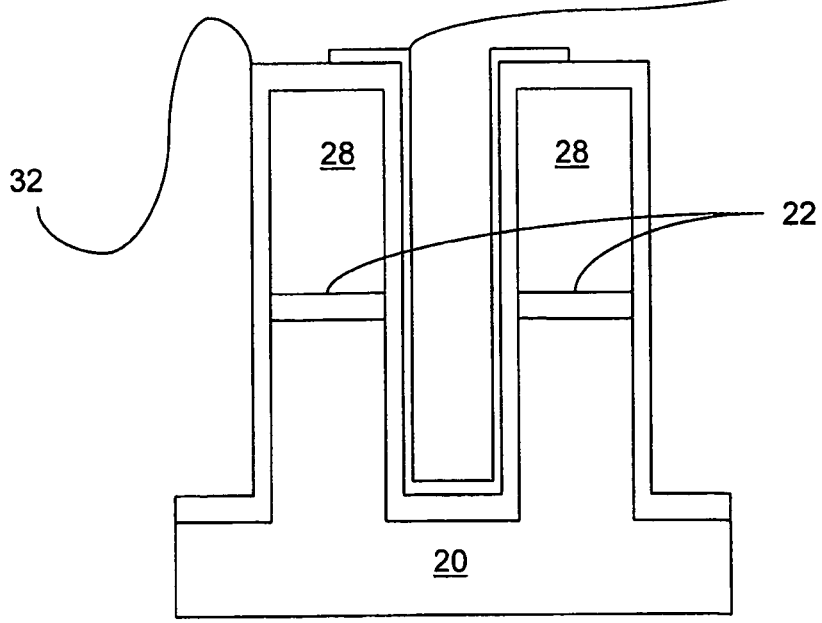
FIG. 12 is a block diagram illustrating removal of deposition of a layer of gold on active emitter sites on an emitter configured in accord with one embodiment of the present invention.
Figure 13:
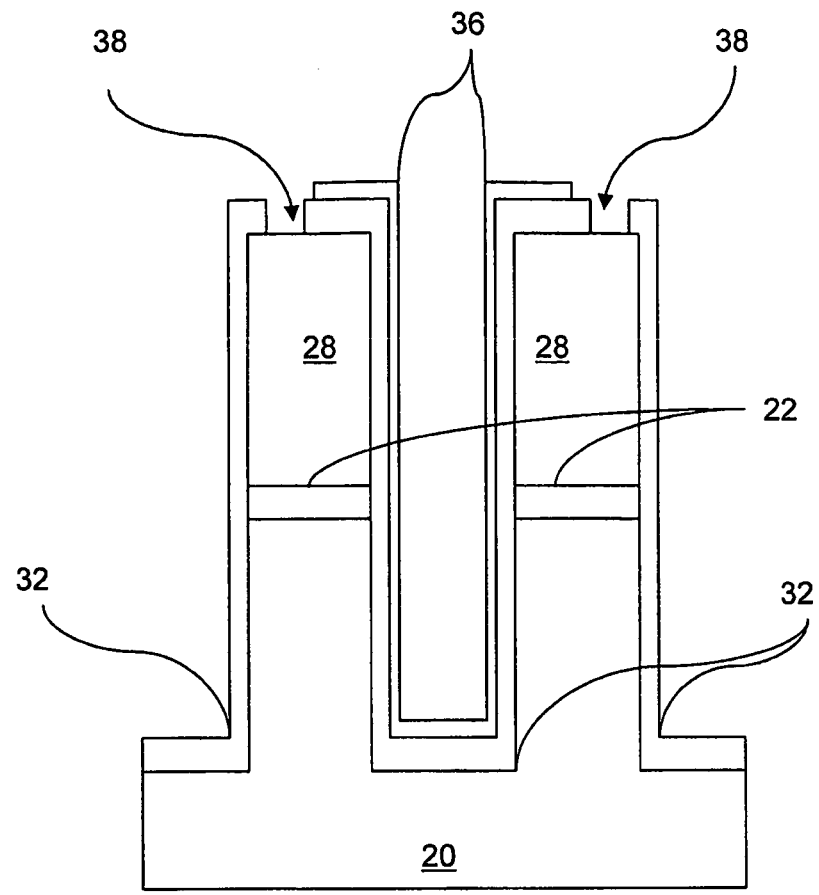
FIG. 13 is a block diagram illustrating removal of opening vias on active emitter sites on an emitter configured in accord with one embodiment of the present invention.
Figure 14:
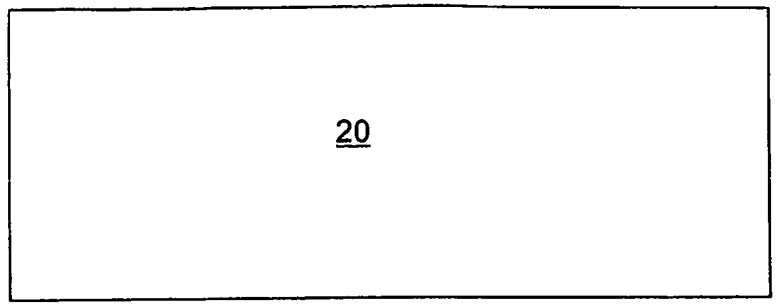
FIG. 14 is a block diagram illustrating a silicon substrate of an emitter configured in accord with one embodiment of the present invention.

As illustrated in FIG. 11, photoresist 34 is again applied, coating non-active portions of the device and allowing active areas to be exposed. These exposed areas are then coated with gold 36. This coating of gold 36, illustrated in FIG. 12, may in some embodiments is less than about approximately 1000 angstroms, and typically between about approximately 250 and 500 angstroms, and acts to increase the surface reflectivity of the cavity and improve device efficiency. Vias are then opened through the silicon nitride to allow metal contact formation to the heater material resulting in a structure such as that illustrated in FIG. 13. Gold or aluminum contacts (Not shown) are then applied to the heater elements to allow current to be injected into the heating element.

In an alternative embodiment to the silicon nitride encapsulation of the heater element would be CVD deposition of boron nitride.

Figure 15:
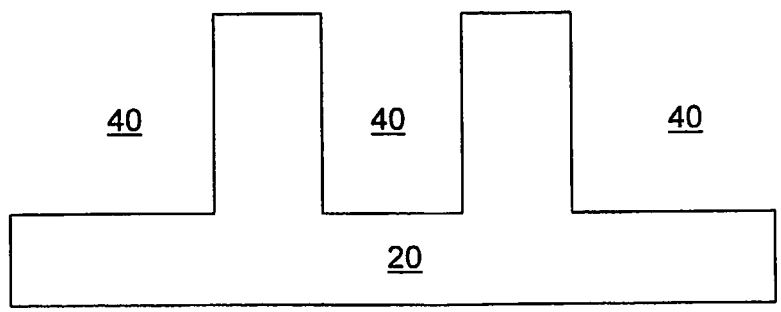
FIG. 15 is a block diagram illustrating etching a silicon substrate of an emitter configured in accord with one embodiment of the present invention.

In an alternative embodiment illustrated in FIGS. 14-21, the silicon substrate wafer 20 is first etched with cavities 40 as in FIG. 15 to form bases for etching the substrate in such a way enhances the depth of the wells 40 and improves performance of the structure. The depth of well etchings 40 in the wafer 20 may, according to one such embodiment be about approximately 500 Å.

Figure 16:
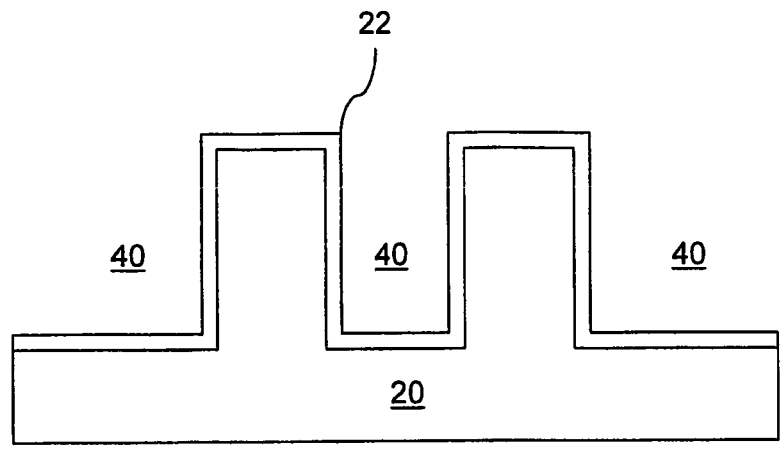
FIG. 16 is a block diagram illustrating a silicon substrate coated with a silicon nitride layer of an emitter configured in accord with one embodiment of the present invention.
Figure 17:
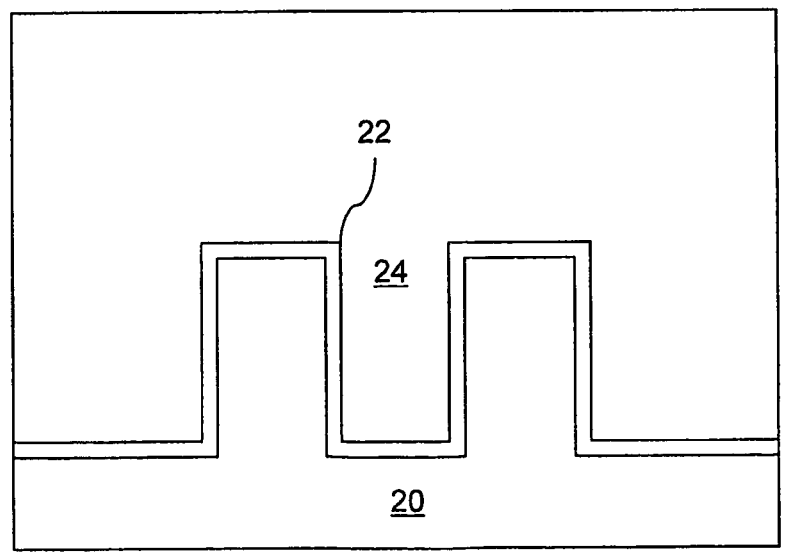
FIG. 17 is a block diagram illustrating a silicon substrate and sacrificial silicon dioxide mold layer for forming an emitter configured in accord with one embodiment of the present invention.
Figure 18:
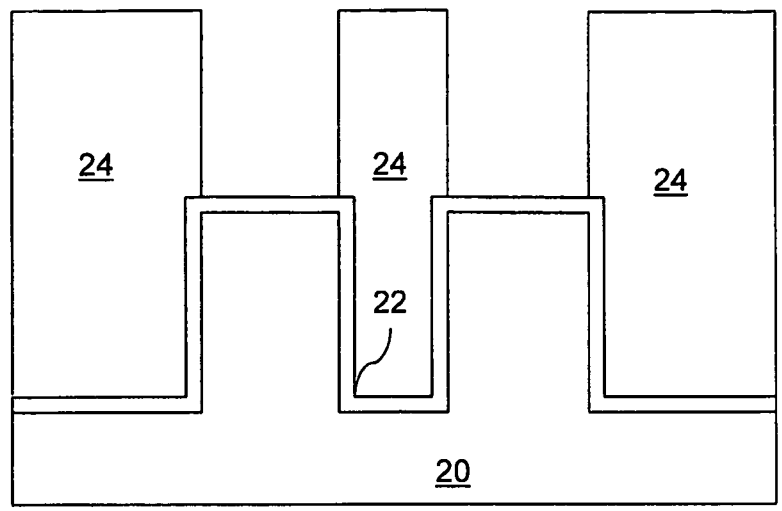
FIG. 18 is a block diagram illustrating a silicon substrate and sacrificial silicon dioxide mold layer with etched mold openings for forming an emitter configured in accord with one embodiment of the present invention.
Figure 19:
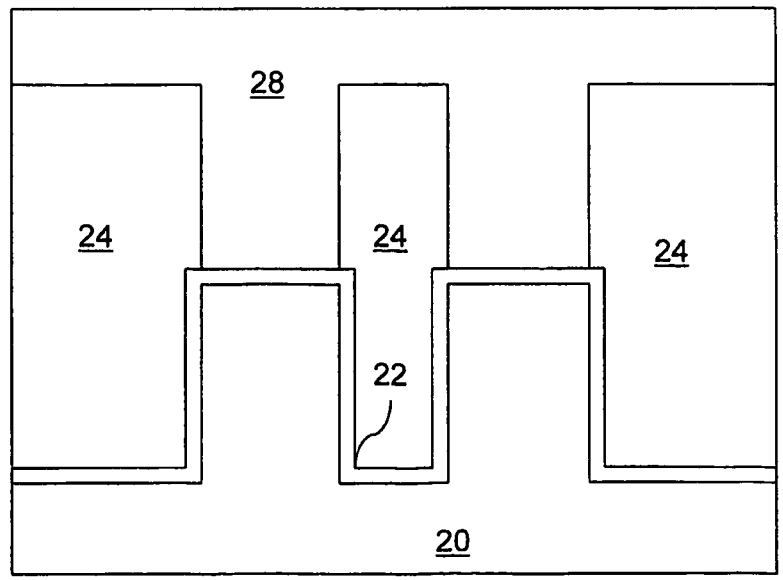
FIG. 19 is a block diagram illustrating a deposition of a layer of emitter material for forming an emitter configured in accord with one embodiment of the present invention.
Figure 20:
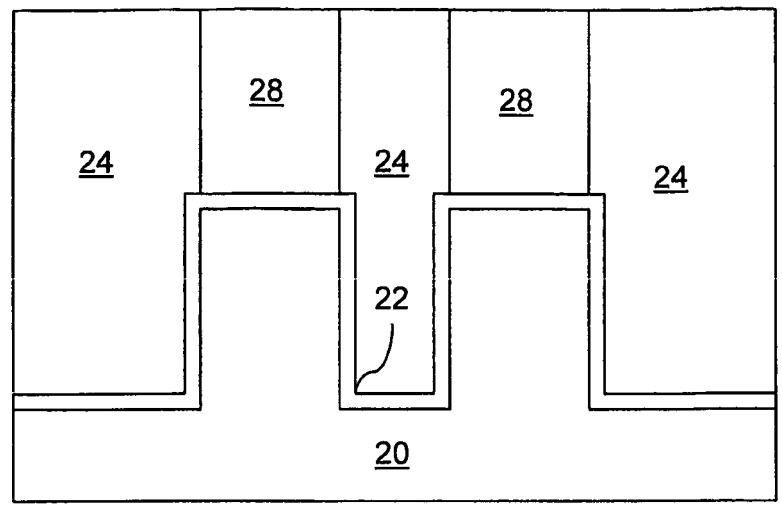
FIG. 20 is a block diagram illustrating removal by chemi-mechanical polishing of excess emitter material of an emitter configured in accord with one embodiment of the present invention.
Figure 21:
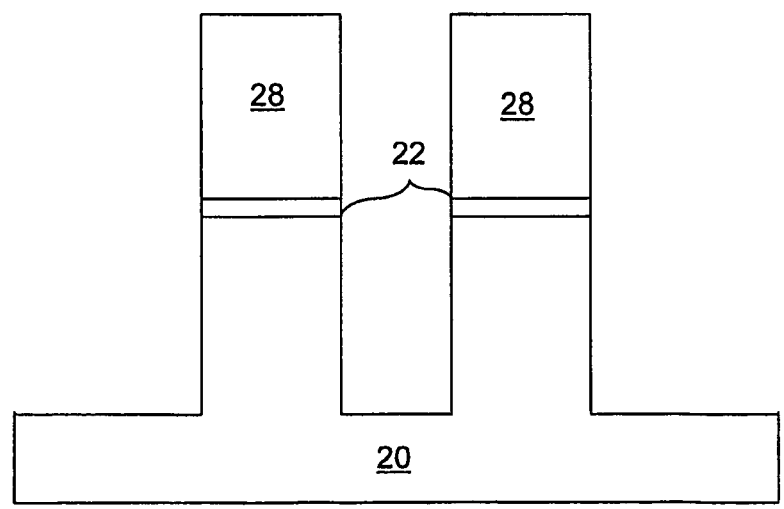
FIG. 21 is a block diagram illustrating removal of sacrificial silicon dioxide and excess silicon nitride from an emitter configured in accord with one embodiment of the present invention.

As illustrated in FIG. 16, as in the other embodiment, silicon nitrite or boron nitrite is applied to the substrate 20. A layer of silicon dioxide 24, as in FIG. 17 is deposited on the silicon nitride 22 filling the well etchings 40 and building up a layer on the surface. CMP is utilized to insure planarity of the surfaces. The silicon dioxide layer 24 is then etched forming a negative of the desired emitter design. Such a structure is illustrated in FIG. 18. Tungsten or another emitter material is then deposited in an emitter material layer 28 as illustrated in FIG. 19. As illustrated in FIG. 20 the emitter layer is polished with CMP to a thickness where only emitter elements 28 remain, disposed between silicon dioxide mold structures 24. These mold structured and silicon nitride coating are then removed producing a structure like that illustrated in FIG. 21. The structure thus produced is then processed as in the other described embodiment.

While the present invention has been described in connection with the embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method comprising:
   etching a semiconductive substrate to form a well;
   after etching the semiconductor substrate to form the well, applying a barrier layer on the semiconductive substrate;
   applying a mold layer on the barrier layer;
   etching the mold layer to at least partially expose the barrier layer and to create at least one emitter mold;
   depositing an emitter material in the emitter mold and on the barrier layer exposed by said etching the mold layer; and
   removing the mold layer.

2. The method of claim 1, further comprising:
   removing a portion of the barrier layer to expose a portion of the semiconductive substrate; and
   etching a well into the portion of the semiconductive substrate exposed by said removing a portion of the barrier layer.

3. The method of claim 1, wherein the barrier layer comprises at least one of boron nitride or silicon nitride.

4. The method of claim 1, wherein the mold layer comprises silicon dioxide.

5. The method of claim 1, wherein the emitter material comprises at least one of tungsten, silicon carbide, or carbon and alloys thereof.

6. The method of claim 1, further comprising applying an insulation layer to the emitter material.

7. The method of claim 6, further comprising depositing a reflective coating on at least a portion of the insulation layer.

8. A method comprising:
   disposing a first insulation layer over a semiconductive substrate;
   disposing an emitter material over a first portion of the first insulation layer;
   removing a second portion of the first insulation layer to expose a portion of the semiconductive substrate;
   creating a well in the portion of the semiconductive substrate exposed by said removing a second portion of the first insulation layer;

disposing a second insulation layer over the emitter material and the well;
disposing a reflective layer over at least a portion of the second insulation layer; and
creating at least one via opening in the second insulation layer to expose the emitter material.

9. The method of claim 8, further comprising:
disposing a mold layer over the first insulation layer;
patterning the mold layer to expose the first portion of the first insulation layer; and
disposing the emitter material in the mold layer.

10. The method of claim 9, further comprising removing the mold layer.

11. A method comprising:
disposing a first insulation layer over a semiconductive substrate;
disposing an emitter material over a first portion of the first insulation layer;
removing a second portion of the first insulation layer to expose a portion of the semiconductive substrate;
disposing a second insulation layer over the emitter material;
disposing a reflective layer over at least a portion of the second insulation layer; and
creating at least one via opening in the second insulation layer to expose the emitter material.

12. The method of claim 11, further comprising:
disposing a mold layer over the first insulation layer prior to said disposing an emitter material; and
patterning the mold layer to expose the first portion of the first insulation layer, wherein the emitter material is disposed over the first portion of the first insulation layer exposed by said patterning of the mold layer.

13. The method of claim 12, further comprising removing the mold layer.

14. The method of claim 11, further comprising creating a well in the portion of the semiconductive substrate exposed by said removing a second portion of the first insulation layer.

15. A method comprising:
etching a well in a semiconductive substrate;
after etching the well in the semiconductor substrate, disposing a first insulation layer over the semiconductive substrate;
disposing an emitter material over a first portion of the first insulation layer;
disposing a mold layer over the first insulation layer prior to said disposing an emitter material;
patterning the mold layer to expose the first portion of the first insulation layer, wherein the emitter material is disposed over the first portion of the first insulation layer exposed by said patterning of the mold layer; and
removing a second portion of the first insulation layer to expose a portion of the semiconductive substrate.

16. The method of claim 15, further comprising removing the mold layer.

* * * * *